(12) United States Patent
Chase et al.

(10) Patent No.: US 9,275,975 B2
(45) Date of Patent: Mar. 1, 2016

(54) ELECTRONIC PACKAGE AND METHOD OF CONNECTING A FIRST DIE TO A SECOND DIE TO FORM AN ELECTRONIC PACKAGE

(71) Applicants: Harold Ryan Chase, Mesa, AZ (US); Mathew J Manusharow, Phoenix, AZ (US); Mihir K Roy, Chandler, AZ (US)

(72) Inventors: Harold Ryan Chase, Mesa, AZ (US); Mathew J Manusharow, Phoenix, AZ (US); Mihir K Roy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/228,887

(22) Filed: Mar. 28, 2014

(65) Prior Publication Data

US 2015/0279813 A1    Oct. 1, 2015

(51) Int. Cl.
| | |
|---|---|
| *H01L 21/00* | (2006.01) |
| *H01L 25/065* | (2006.01) |
| *H01L 23/13* | (2006.01) |
| *H01L 23/538* | (2006.01) |
| *H01L 23/00* | (2006.01) |
| *H01L 21/56* | (2006.01) |
| *H01L 21/768* | (2006.01) |
| *H01L 23/31* | (2006.01) |
| *H01L 25/00* | (2006.01) |

(52) U.S. Cl.
CPC ............ *H01L 25/0652* (2013.01); *H01L 21/56* (2013.01); *H01L 21/768* (2013.01); *H01L 23/13* (2013.01); *H01L 23/3157* (2013.01); *H01L 23/5386* (2013.01); *H01L 23/5389* (2013.01); *H01L 24/19* (2013.01); *H01L 25/0657* (2013.01); *H01L 25/50* (2013.01); *H01L 2224/04105* (2013.01); *H01L 2224/16145* (2013.01); *H01L 2224/16225* (2013.01); *H01L 2224/2919* (2013.01); *H01L 2224/32145* (2013.01); *H01L 2224/32225* (2013.01); *H01L 2224/73204* (2013.01); *H01L 2224/81005* (2013.01); *H01L 2224/81203* (2013.01); *H01L 2224/83005* (2013.01); *H01L 2224/83855* (2013.01); *H01L 2224/92125* (2013.01); *H01L 2225/06541* (2013.01); *H01L 2225/06548* (2013.01); *H01L 2225/06555* (2013.01); *H01L 2924/1433* (2013.01); *H01L 2924/14335* (2013.01); *H01L 2924/15153* (2013.01); *H01L 2924/15192* (2013.01); *H01L 2924/18162* (2013.01)

(58) Field of Classification Search
CPC .......................................... H01L 25/00–25/0756
See application file for complete search history.

(56) References Cited

U.S. PATENT DOCUMENTS

| | | | |
|---|---|---|---|
| 3,698,082 A | 10/1972 | Hyltin et al. | |
| 6,400,573 B1 * | 6/2002 | Mowatt et al. | ................. 361/719 |

(Continued)

*Primary Examiner* — Julio J Maldonado
*Assistant Examiner* — Cory Eskridge
(74) *Attorney, Agent, or Firm* — Schwegman Lundberg & Woessner, P.A.

(57) ABSTRACT

Some embodiments relate to an electronic package. The electronic package includes a substrate that includes a plurality of buildup layers. A first die is embedded in one of the buildup layers on one side of the substrate. A second die is bonded to the substrate within a cavity on an opposing side of the substrate. The first die and the second die may be electrically connected to conductors within the plurality of buildup layers. Other embodiments relate to method of connecting a first die to a second die to form an electronic package. The method includes attaching a first die to a core and fabricating a substrate onto the core. The method further includes creating a cavity in another of the buildup layers on an opposing side of the substrate and attaching a second die to the substrate within the cavity.

9 Claims, 7 Drawing Sheets

(56) References Cited

U.S. PATENT DOCUMENTS

| | | |
|---|---|---|
| 6,784,377 B2 | 8/2004 | Chamberlin et al. |
| 7,956,713 B2 | 6/2011 | Chandrasekhar et al. |
| 2003/0085471 A1 | 5/2003 | Iijima et al. |
| 2006/0044083 A1 | 3/2006 | Kuzmenka |
| 2007/0124930 A1 | 6/2007 | Cheng et al. |
| 2009/0291524 A1* | 11/2009 | Takahashi .................. 438/108 |
| 2011/0037169 A1* | 2/2011 | Pagaila ....................... 257/737 |
| 2014/0159228 A1* | 6/2014 | Teh et al. .................... 257/734 |

* cited by examiner

ELECTRONIC PACKAGE AND METHOD OF CONNECTING A FIRST DIE TO A SECOND DIE TO FORM AN ELECTRONIC PACKAGE

TECHNICAL FIELD

Embodiments described herein generally relate to an electronic package and a method of connecting a first die to another die to form an electronic package.

BACKGROUND

Conventional electronic packages are commonly structured in a package-on-package (PoP configuration) and/or some form of flip-chip (FC) bonding configuration. Electronic packages that are arranged in these types of configurations are commonly limited in functionality. In addition, these configurations can make it difficult to produce different types of products that are easily integrated with an electronic package that includes an embedded die, especially electronic packages where it may be desirable to minimize the z-height of the electronic package.

Some conventional electronic packages combine dice with various buildup layer packages by using PoP architectures. PoP architectures are often undesirably associated with more circuitous electric paths between the dice in the overall PoP architecture.

Another known package type relates to die embedding. One difficulty associated with embedding multiple dice relates to aligning embedded multiple dice into the same electronic package. The difficulties related to aligning multiple embedded dice is due in part to potential complications associated with producing the fine alignment that is necessary between the conductor patterns of multiple embedded dice that are in the same electronic package.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic packages and methods described herein may serve to improve the alignment between dice in multi-chip packages (MCPs) as well as the placement of one or more dice relative to the rest of the electronic package. The alignment between dice may be improved by aligning additional dice to an already existing conductor pattern that exists in cavities which are created during fabrication of the electronic packages.

The improved alignment between dice in multi-chip packages (MCPs) may enhance coreless products that are designed to be MCP which may be used in some handheld/smart phone products. Other example electronic packages and/or products include stacked DRAM, CPU/PCH combinations. Examples for the mobile segment include the package integration of the Digital Baseband chip, and potentially integrated PMIC.

The electronic packages and methods described herein may offer much more direct paths between MCP dice. The electronic packages and methods described herein may also bring at least one non-embedded die into the electronic package through the creation of a cavity in the electronic package and subsequent attachment of at least one non-embedded die within the cavity (e.g., through TCB).

The electronic packages and methods described herein may also be incorporated into electronic packages for products where z-height is at a premium and various chips can advantageously combined on the same package. Various flexible manufacturing strategies may also be developed where different types of chips could be added to the MCP depending on the desired type of electronic package. In addition, an embedded die routing test may be done on a package level before committing additional dice to the MCP.

Figure 1:
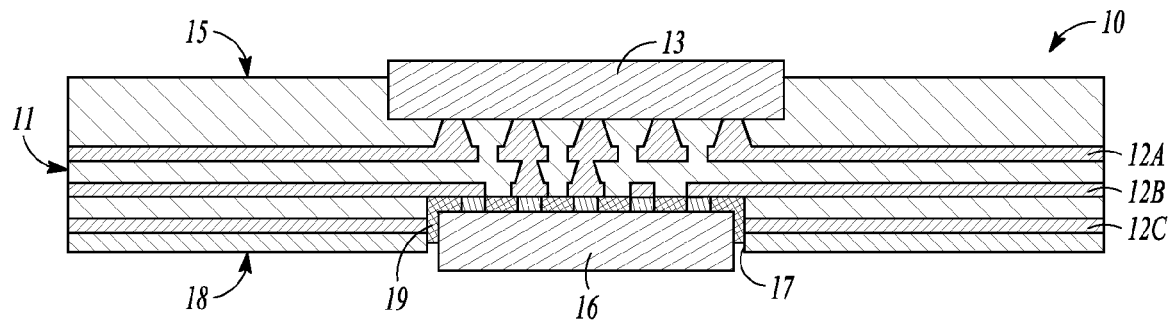
FIG. 1 illustrates an example electronic package.

FIG. 1 illustrates an example electronic package 10. The electronic package 10 includes a substrate 11 that includes a plurality of buildup layers 12A, 12B, 12C. A first die 13 is embedded in one of the buildup layers 12A on one side 15 of the substrate 11.

A second die 16 is bonded to the substrate 11 within a cavity 17 on an opposing side 18 of the substrate 11. The first die 13 and the second die 16 may be electrically connected to conductors within the plurality of buildup layers 12A, 12B, 12C. The type, size and configuration of each of the first die 13 and the second die 16 that are included in the electronic package 10 will depend in part on the overall desired configuration and function of the electronic package 10.

In the example electronic package 10 shown in FIG. 1, the second die 16 may be attached to conductors within one of the buildup layers 12B by thermal compression bonding. It should be noted that the second die 16 may be attached to conductors within one of the buildup layers 12B by any bonding method that is known now or discovered in the future. The manner in which the second die 16 is bonded to the substrate 11 will depend in part on cost, manufacturing considerations and the functionality associated with fabricating the electronic package 10 (among other factors).

In some example forms, the example electronic package 10 may further include an underfill 19 between the second die 16 and the buildup layer 12B that includes the conductors that are thermal compression bonded to the second die 16. The underfill 19 may be formed of an epoxy-like material, or any other material that is known now or discovered in the future. The type of material that is used for the underfill 19 will depend in part on cost, manufacturing considerations and the functionality associated with fabricating the electronic package 10 (among other factors).

Figure 2:
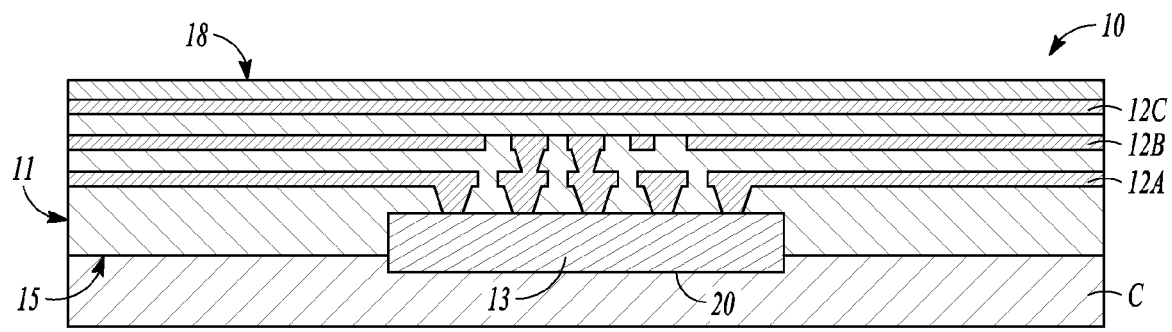
FIG. 2 shows a partial assembly of the electronic package shown of FIG. 1.
Figure 7:
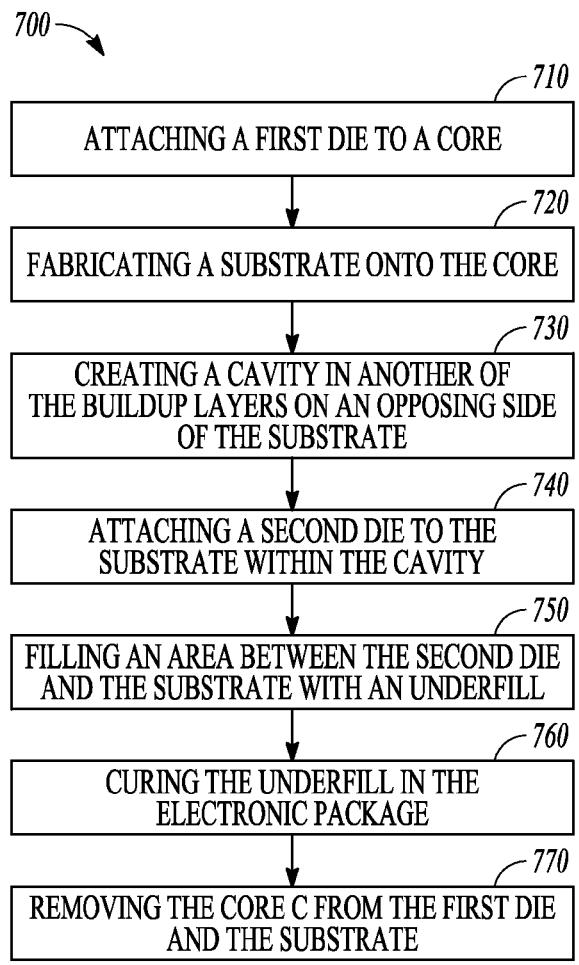
FIG. 7 is a flow diagram illustrating a method of connecting a first die to a second die to form an electronic package.

FIG. 7 is a flow diagram illustrating a method [700] of connecting a first die to a second die to form an electronic package 10 (see FIG. 1). The method [700] includes [710] attaching a first die 13 to a core C and [720] fabricating a substrate 11 onto the core C. The substrate includes 11 a plurality of buildup layers 12A, 12B, 12C. The first die 13 is embedded in one of the buildup layers 12A on one side 15 of the substrate 11 (see, e.g., FIG. 2).

As an example, [710] attaching the first die 13 to the core C may include attaching the first die 13 within a cavity 20 in the core C in order to embed the first die 13 in one of the buildup layers 12A on the one side 15 of the substrate 11. The degree which the first die 13 is embedded in the substrate 11 will depend in part on cost, configuration, manufacturing considerations and functionality associated with fabricating the electronic package 10 (among other factors).

Figure 3:
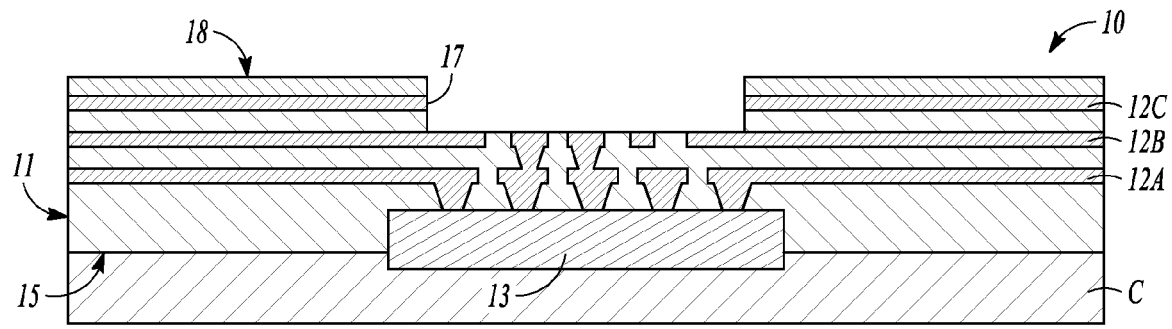
FIG. 3 shows the partial assembly of FIG. 2 after a cavity has been formed in the electronic package.
Figure 4:
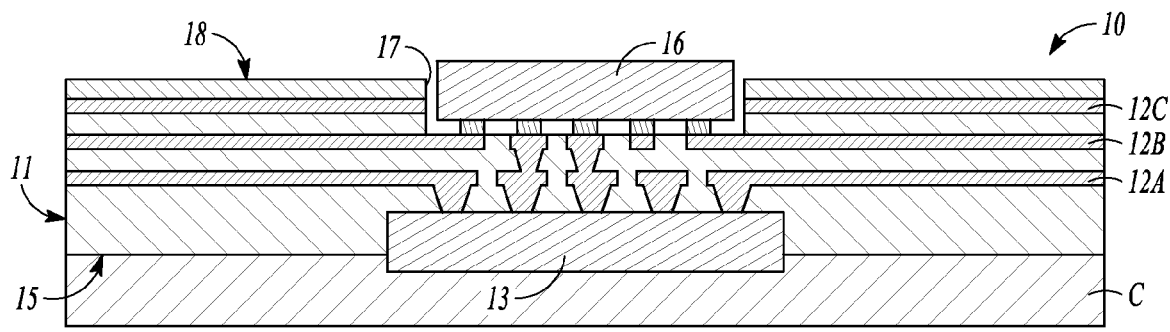
FIG. 4 shows the partial assembly of FIG. 3 after a die has attached to conductors in the cavity.

The method [700] further includes [730] creating a cavity 17 in another of the buildup layers 12C on an opposing side 18 of the substrate 11 (see, e.g., FIG. 3) and [740] attaching a second die 16 to the substrate 11 within the cavity 17 (see, e.g., FIG. 4). As discussed above, [740] attaching the second die 16 to the substrate 11 within the cavity 17 may include attaching the second die 16 using thermal compression bonding (or any other type of bonding). In addition, the cavity may be created in any number of ways (e.g. laser drill routing).

The cavity 17 on the opposing side 18 of the substrate 11 to the embedded first die 13 may be created in such a way as to provide access to the underlying conductor pattern in another of the buildup layers 12B. After cleaning and prepping the exposed areas of the underlying conductor pattern in buildup layer 12B, the second die 16 may be attached by thermal compression bonding (or any other type of bonding).

Figure 5:
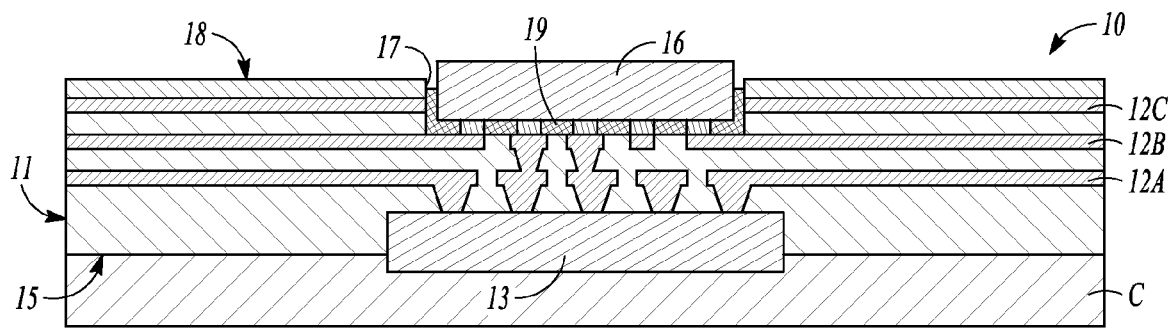
FIG. 5 shows the partial assembly of FIG. 4 after an underfill has been inserted under the die within the cavity.

The method [700] may further include [750] filling an area between the second die 16 and the substrate 11 with an underfill 19 (see, e.g., FIG. 5), and [760] curing the underfill in the electronic package 10. The appropriate curing process may be based in part on the types of materials and components that are used in the electronic package 10 as well as the associated manufacturing costs (among other factors).

Figure 6:
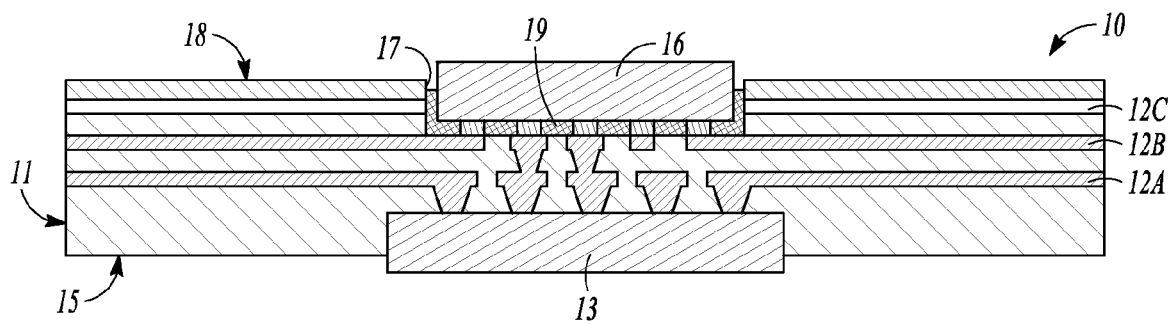
FIG. 6 shows the partial assembly of FIG. 5 after a core has been removed from the substrate to form the electronic package.

The method [700] may further include [770] removing the core C from the first die 16 and the substrate 11 (see, e.g., FIG. 6). As an example, the core C may be removed from the first die 16 and the substrate 11 by using a peel-enabled core, although it should be noted that any process may be used to remove the core C.

Figure 8:
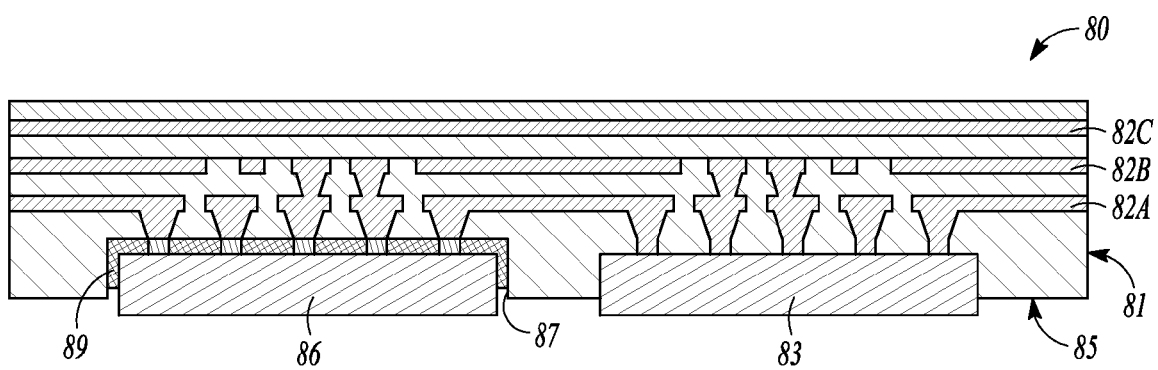
FIG. 8 illustrates another example electronic package.

FIG. 8 illustrates another example electronic package 80. The electronic package 80 includes a substrate 81 that includes a plurality of buildup layers 82A, 82B, 82C. A first die 83 is embedded in one of the buildup layers 82A on one side 85 of the substrate 81. In other forms, the first die 83 may be embedded to any depth within the electronic package 10 such that the first dies engages conductive layers within any of the plurality of buildup layers 82A 82B, 82C.

A second die 86 is bonded to the substrate 81 within a cavity 87 on the same side 85 of the substrate 81. The first die 83 and the second die 86 may be connected to conductors within any of the plurality of buildup layers 82A, 82B, 82C. It should be noted that depth of the cavity 87 may vary such that the second die 86 engages conductive layers within any of the plurality of buildup layers 82A 82B, 82C depending on the depth of the cavity 87. The type, size and configuration of each of the first die 83 and the second die 86 that are included in the electronic package 80 will depend in part on the overall desired configuration and function of the electronic package 80.

In the example electronic package 80 shown in FIG. 8, the second die 86 may be attached to conductors within one of the buildup layers 82B by thermal compression bonding. It should be noted that the second die 86 may be attached to conductors within one of the buildup layers 82B by any bonding method that is known now or discovered in the future. The manner in which the second die 86 is bonded to the substrate 81 will depend in part on cost, manufacturing considerations and the functionality associated with fabricating the electronic package 80 (among other factors).

In some example forms, the example electronic package 80 may further include an underfill 89 between the second die 86 and the buildup layer 82B that includes the conductors that are thermal compression bonded to the second die 86. The underfill 89 may be formed of an epoxy-like material, or any other material that is known now or discovered in the future. The type of material that is used for the underfill 89 will depend in part on cost, manufacturing considerations and the functionality associated with fabricating the electronic package 80 (among other factors).

Figure 9:
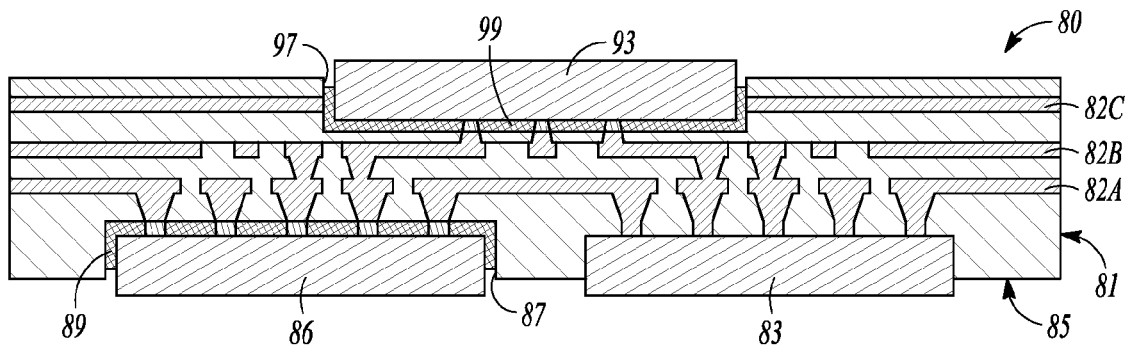
FIG. 9 illustrates another example form of the electronic package shown in FIG. 8.

FIG. 9 illustrates another example form of the electronic package 80 shown in FIG. 8. The electronic package 80 may further include a third die 93 that is bonded to the substrate 81 within a cavity 97 on an opposing side 88 of the substrate 81. The first die 83 and the second die 86 may be electrically connected to the third die 93 through conductors within the plurality of buildup layers 82A, 82B, 82C. As discussed above, the example electronic package 80 may further include an underfill 99 within the cavity 97 between the third die 93 and the substrate 81 that includes the conductors that are thermal compression bonded to the third die 93. It should be noted that it is contemplated to include one or more additional dies on each side 85, 88 of the substrate. The additional dies may be embedded in the substrate 81 or attached within cavities in the substrate 81.

Figure 10:
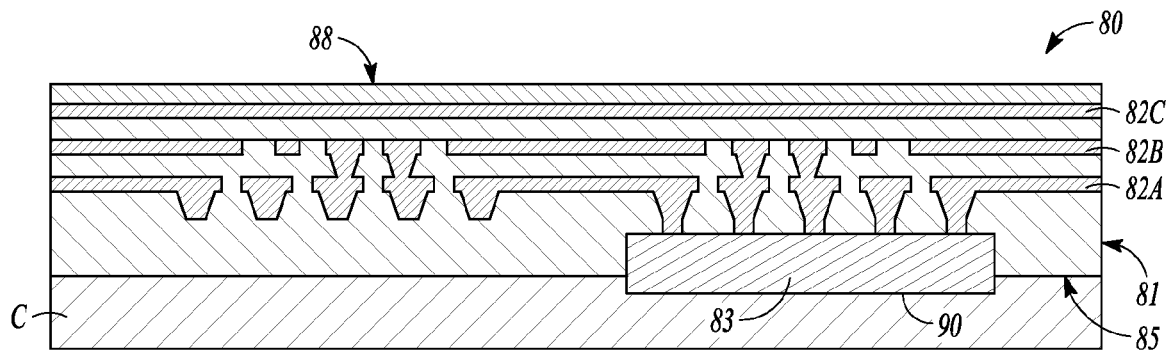
FIG. 10 shows a partial assembly of the electronic package shown of FIG. 8.
Figure 15:
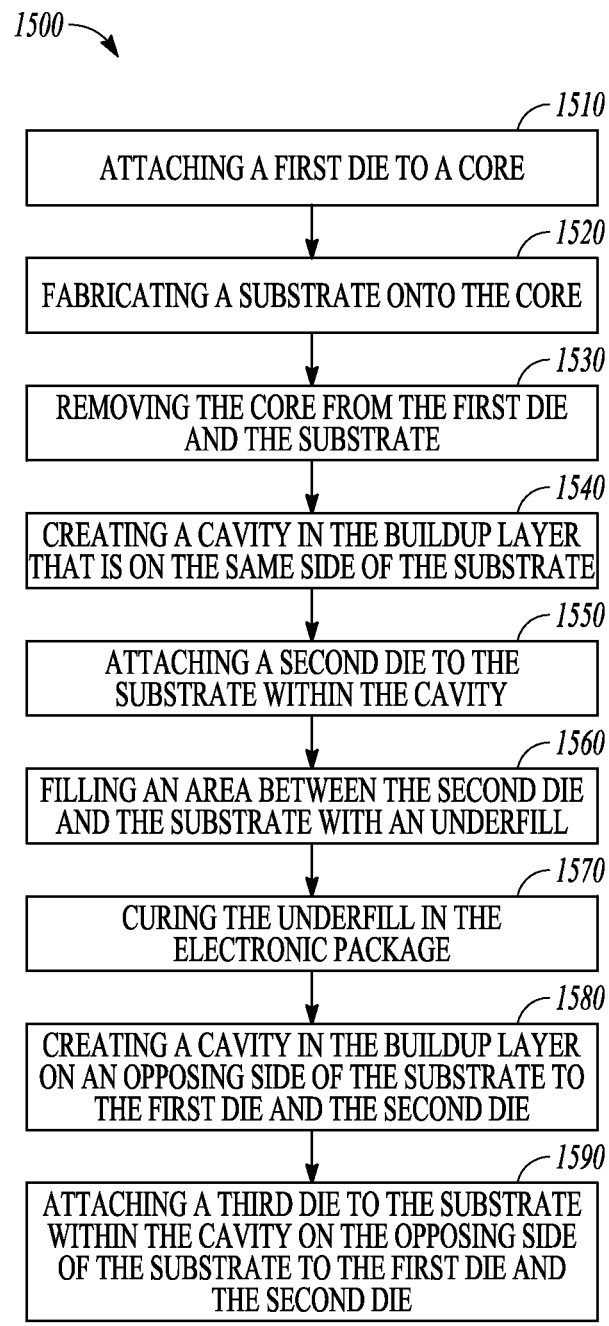
FIG. 15 is a flow diagram illustrating another method of connecting a first die to a second die to form an electronic package.

FIG. 15 is a flow diagram illustrating a method [1500] of connecting a first die to a second die to form an electronic package 80 (see FIG. 8). The method [1500] includes [1510] attaching a first die 83 to a core C and [1520] fabricating a substrate 81 onto the core C. The substrate includes 81 a plurality of buildup layers 82A, 82B, 82C. The first die 83 is embedded in one of the buildup layers 82A on one side 85 of the substrate 81 (see, e.g., FIG. 10).

As an example, [1510] attaching the first die 83 to the core C may include attaching the first die 83 within a cavity 90 in the core C in order to embed the first die 83 in one of the buildup layers 82A on the one side 85 of the substrate 81. The degree which the first die 83 is embedded in the substrate 81 will depend in part on cost, configuration, manufacturing considerations and functionality associated with fabricating the electronic package 80 (among other factors).

Figure 11:
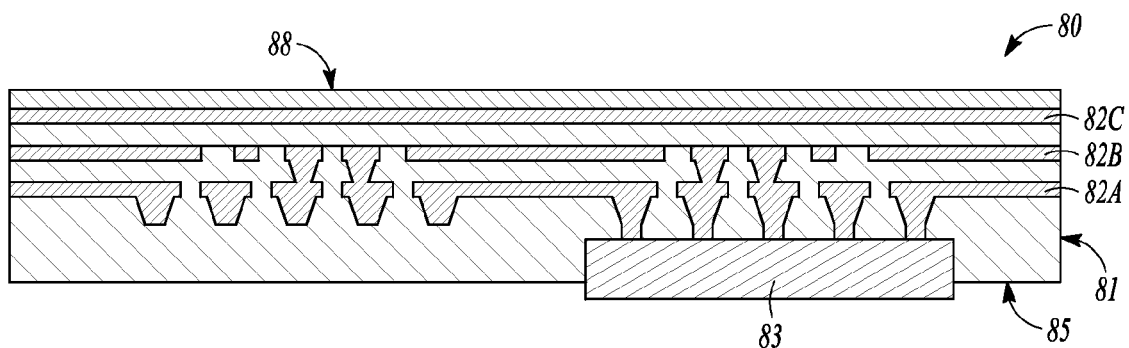
FIG. 11 shows the partial assembly of FIG. 10 after a core has been removed from the substrate to form the electronic package.

The method [1500] may further include [1530] removing the core C from the first die 86 and the substrate 81 (see, e.g., FIG. 11). As an example, the core C may be removed from the first die 86 and the substrate 81 by using a peelable core, although it should be noted that any process may be used to remove the core C.

Figure 12:
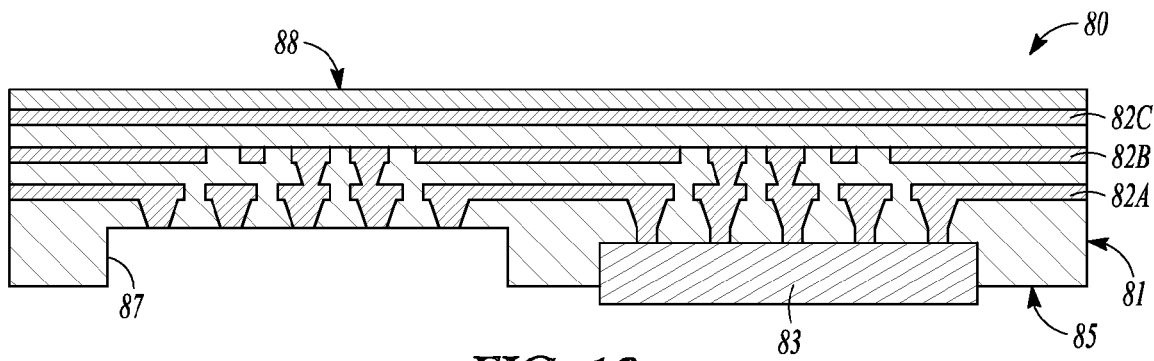
FIG. 12 shows the partial assembly of FIG. 11 after a cavity has been formed in the electronic package.
Figure 13:
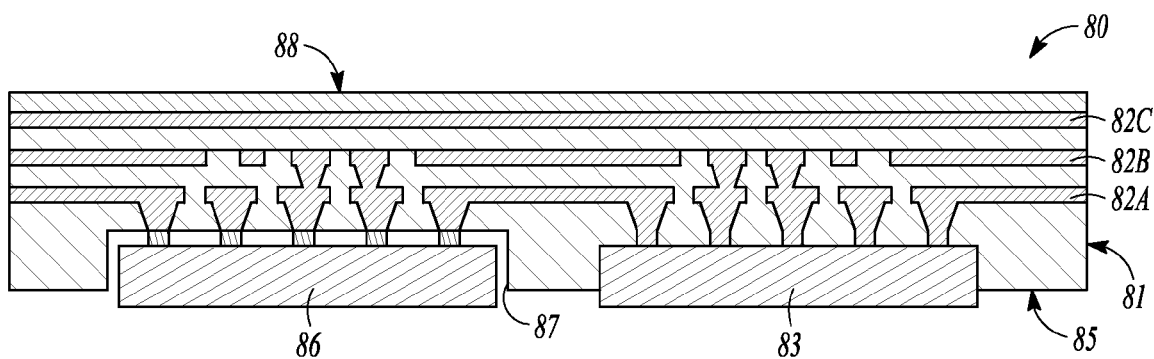
FIG. 13 shows the partial assembly of FIG. 12 after a die has attached to conductors in the cavity.

The method [1500] further includes [1540] creating a cavity 87 in the buildup layer 82A that is on the same side 85 of the substrate 81 as the first die 83 (see, e.g., FIG. 12) and [1550] attaching a second die 86 to the substrate 81 within the cavity 87 (see, e.g., FIG. 13). As discussed above, [1550] attaching the second die 86 to the substrate 81 within the cavity 87 may include attaching the second die 86 using thermal compression bonding (or any other type of bonding). In addition, the cavity may be created in any number of ways (e.g. laser drill routing) to many possible depths depending on the overall design of the electronic package.

The cavity 87 that is on the same side 85 of the substrate 81 as the embedded first die 83 may be created in such a way as to provide access to the underlying conductor pattern in any of the buildup layers 82A, 82B, 82C depending on the depth of the cavity 87. After cleaning and prepping the exposed areas of the underlying conductor pattern in buildup layer 82B, the second die 86 may be attached by thermal compression bonding (or any other type of bonding).

Figure 14:
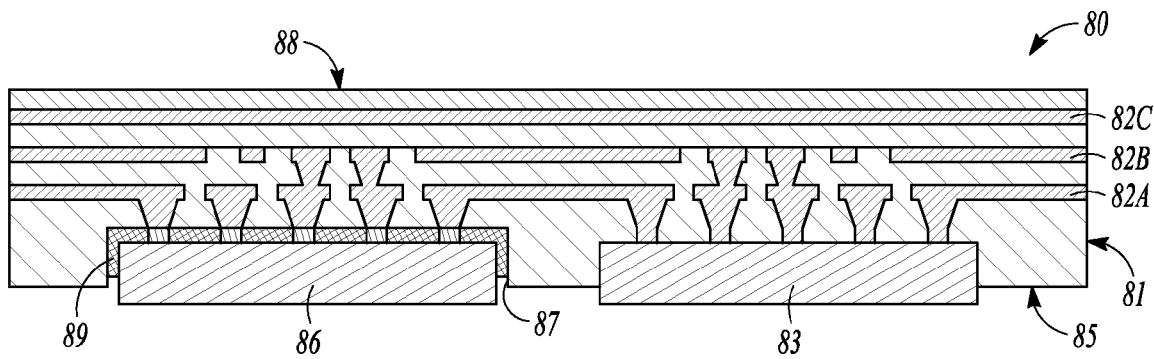
FIG. 14 shows the partial assembly of FIG. 13 after an underfill has been inserted under the die within the cavity.

The method [1500] may further include [1560] filling an area between the second die 86 and the substrate 81 with an underfill 89 (see, e.g., FIG. 14), and [1570] curing the underfill in the electronic package 80. The appropriate curing process may be based in part on the types of materials and components that are used in the electronic package 80 as well as the associated manufacturing costs (among other factors).

The method [1500] may further include [1580] creating a cavity 97 in the buildup layer 82C on an opposing side 88 of the substrate 81 to the first die 83 and the second die 86. The method [1500] may further include [1590] attaching a third die 93 to the substrate 81 within the cavity 97 on the opposing side 88 of the substrate 81 to the first die 83 and the second die 86 (see, e.g., FIG. 9). As discussed above, the method [1500] may further include inserting an underfill 99 within the cavity 97 between the third die 93 and the substrate 81.

Other forms of the method [1500] are contemplated where similar processes (or portions of processes) are repeated in order to place additional dice on either side 85, 88 of the substrate 81. The additional dice may be embedded in the substrate 81 and/or attached within cavities in the substrate 81.

Figure 16:
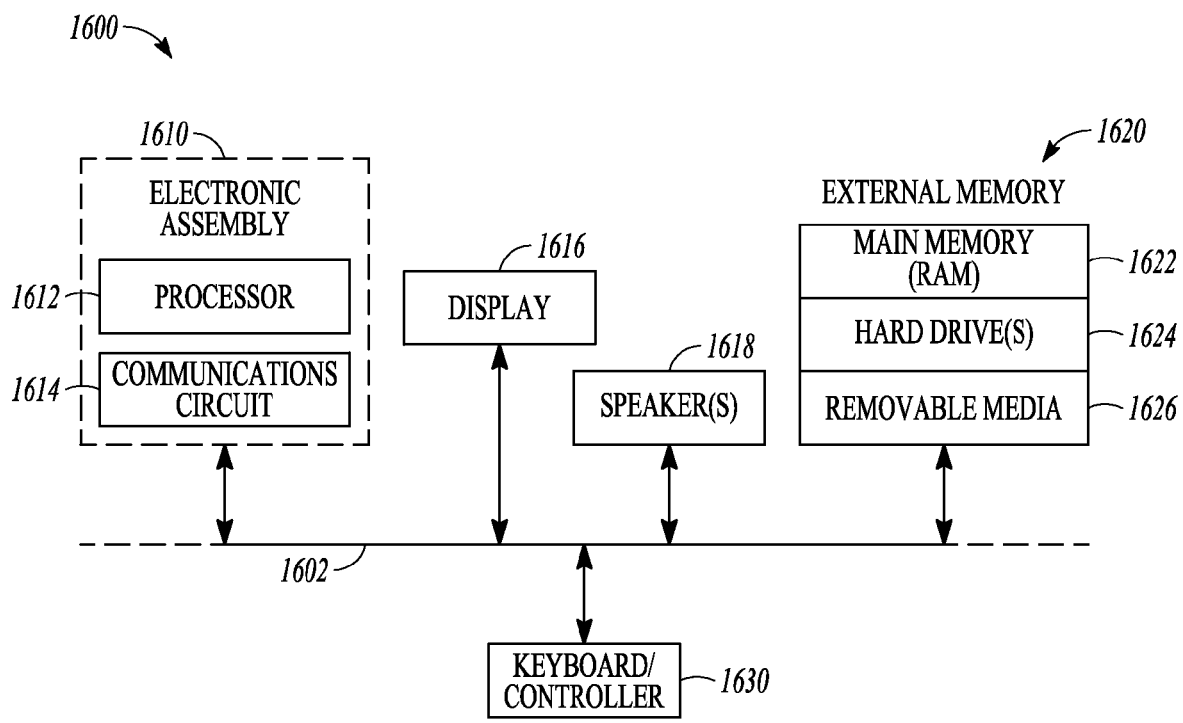
FIG. 16 is a block diagram of an electronic device incorporating at least one electronic package and/or method of connecting a first die to a second die to form an electronic package.

An example of an electronic device using the electronic packages methods of connecting a first die to a second die to form electronic packages that are described in the present disclosure is included to show an example of a higher level device application for the present invention. FIG. 16 is a block diagram of an electronic device 1600 incorporating at least one electronic package and/or method described herein. Electronic device 1600 is merely one example of an electronic system in which embodiments of the present invention may be used.

To better illustrate the method and apparatuses disclosed herein, a non-limiting list of embodiments is provided here:

Example 1 includes an electronic package. The electronic package includes a substrate that includes a plurality of buildup layers; a first die embedded in one of the buildup layers on one side of the substrate; and a second die bonded to the substrate within a cavity on an opposing side of the substrate.

Example 2 includes the electronic package of claim 1, wherein the first die and the second die are connected to conductors within the plurality of buildup layers.

Example 3 includes the electronic package of any one of examples 1-2, wherein the second die is attached to conductors within one of the buildup layers by thermal compression bonding.

Example 4 includes the electronic package of any one of examples 1-3, further including an underfill between the second die and the buildup layer that includes the conductors that are thermal compression bonded to the second die.

Example 5 includes a method that includes attaching a first die to a core; fabricating a substrate onto the core, wherein the substrate includes a plurality of buildup layers, wherein the first die is embedded in one of the buildup layers on one side of the substrate; creating a cavity in another of the buildup layers on an opposing side of the substrate; and attaching a second die to the substrate within the cavity.

Example 6 includes the method of example 5, wherein attaching the first die to the core includes attaching the first die within a cavity in the core in order to embed the first die in one of the buildup layers on one side of the substrate.

Example 7 includes the method of any one of examples 5-6, wherein attaching the second die to the substrate within the cavity includes attaching the second die using thermal compression bonding.

Example 8 includes the method of any one of examples 5-7, further comprising filling an area between the second die and the substrate with an underfill.

Example 9 includes the method of any one of examples 5-8, further including curing the underfill in the electronic package.

Example 10 includes the method of any one of examples 5-9, and further including removing the core from the first die and the substrate.

Example 11 includes an electronic package. The electronic package includes a substrate that includes a plurality of buildup layers; a first die embedded in one of the buildup layer on one side of the substrate; and a second die bonded to the substrate within a cavity in the one of the buildup layers such that second die is on the same side of the substrate as the first die.

Example 12 includes the electronic package of example 11, wherein the first die and the second die are connected to conductors within the plurality of buildup layers.

Example 13 includes electronic package of any one of examples 11-12, wherein the second die is attached to conductors within one of the buildup layers by thermal compression bonding.

Example 14 includes the electronic package of any one of examples 11-13, further including an underfill between the second die and the buildup layer that includes the conductors that are thermal compression bonded to the second die.

Example 15 includes the electronic package of any one of examples 11-14, further including a third die bonded to the substrate within a cavity in another of the buildup layers on an opposing side of the substrate.

Example 16 includes a method that includes attaching a first die to a core; fabricating a substrate onto the core, wherein the substrate includes a plurality of buildup layers, wherein the first die is embedded in one of the buildup layers on one side of the substrate; removing the core from the first die and the substrate creating a cavity in the buildup layer on the same side of the substrate as the first die; and attaching a second die to the substrate within the cavity.

Example 17 includes the method of any one of example 16, wherein attaching the first die to the core includes attaching the first die within a cavity in the core in order to embed the first die in one of the buildup layers on one side of the substrate.

Example 18 includes the method of any one of examples 16-17, wherein attaching the second die to the substrate within the cavity includes attaching the second die using thermal compression bonding.

Example 19 includes the method of any one of examples 16-18, and further including filling an area between the second die and the substrate with an underfill; and curing the underfill in the electronic package.

Example 20 includes the method of any one of examples 16-19, and further including creating a cavity in the buildup layer on an opposing side of the substrate to the first die and the second die; and attaching the third die to the substrate within the cavity on the opposing side of the substrate to the first die and the second die.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the systems, and methods.

Examples of electronic devices 1600 include, but are not limited to personal computers, tablet computers, mobile telephones, game devices, MP3 or other digital music players, etc. In this example, electronic device 1600 comprises a data processing system that includes a system bus 1602 to couple the various components of the system. System bus 1602 provides communications links among the various components of the electronic device 1600 and can be implemented as a single bus, as a combination of busses, or in any other suitable manner.

An electronic package 1610 is coupled to system bus 1602. The electronic package 1610 can include any circuit or combination of circuits. In one embodiment, the electronic package 1610 includes a processor 1612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 1610 are a custom circuit, an application-specific integrated circuit (ASIC), or the like, such as, for example, one or more circuits (such as a communications circuit 1614) for use in wireless devices like mobile telephones, tablet computers, laptop computers, two-way radios, and similar electronic systems. The IC can perform any other type of function.

The electronic device 1600 can also include an external memory 1620, which in turn can include one or more memory elements suitable to the particular application, such as a main memory 1622 in the form of random access memory (RAM), one or more hard drives 1624, and/or one or more drives that handle removable media 1626 such as compact disks (CD), flash memory cards, digital video disk (DVD), and the like.

The electronic device 1600 can also include a display device 1616, one or more speakers 1618, and a keyboard and/or controller 1630, which can include a mouse, trackball, touch screen, voice-recognition device, or any other device that permits a system user to input information into and receive information from the electronic device 1600.

This overview is intended to provide non-limiting examples of the present subject matter—it is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72 (b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
   attaching a first die to a core, wherein attaching the first die to the core includes attaching the first die within a cavity in the core in order to embed the first die in one of the buildup layers on one side of the substrate;

fabricating a substrate onto the core, wherein the substrate includes a plurality of buildup layers, wherein the first die is embedded in one of the buildup layers on one side of the substrate;

creating a cavity in another of the buildup layers on an opposing side of the substrate; and attaching a second die to the substrate within the cavity; and removing the core from the first die and the substrate.

2. The method of claim 1, wherein attaching the second die to the substrate within the cavity includes attaching the second die using thermal compression bonding.

3. The method of claim 2, further comprising filling an area between the second die and the substrate with an underfill.

4. The method of claim 3, further comprising curing the underfill in the electronic package.

5. A method comprising:

attaching a first die to a core;

fabricating a substrate onto the core, wherein the substrate includes a plurality of buildup layers, wherein the first die is embedded in one of the buildup layers on one side of the substrate;

creating a cavity in another of the buildup layers on an opposing side of the substrate; and attaching a second die to the substrate within the cavity; and removing the core from the first die and the substrate such that a portion of sidewalls on the first die is exposed from the substrate.

6. The method of claim 5, wherein attaching the second die to the substrate within the cavity includes attaching the second die using thermal compression bonding.

7. The method of claim 6, further comprising filling an area between the second die and the substrate with an underfill.

8. The method of claim 7, further comprising curing the underfill in the electronic package.

9. The method of claim 5, wherein attaching a second die to the substrate within the cavity includes attaching the second die such that a portion of sidewalls on the second die is exposed from the substrate.

* * * * *